United States Patent [19]

Duperray et al.

[11] Patent Number: 5,334,557
[45] Date of Patent: Aug. 2, 1994

[54] METHOD OF PREPARING YBA₂CU₃O₇ POWDER FOR FORMING BY DRAWING-LAMINATION

[75] Inventors: G ard Duperray, La Norville; Claudette Audry, Massy; Francoise Ducatel, Bonnelles, both of France

[73] Assignee: Alcatel Alsthom Compagnie Generale d'Electricite, Paris Cedex, France

[21] Appl. No.: 25,795

[22] Filed: Mar. 3, 1993

[30] Foreign Application Priority Data

Mar. 6, 1992 [FR] France .................. 92 02726

[51] Int. Cl.⁵ .................. H01L 39/12; B28B 11/00
[52] U.S. Cl. .................. 505/500; 264/57; 264/65; 264/66; 264/67; 264/140; 505/725; 505/738; 505/742; 505/450
[58] Field of Search .................. 264/65, 66, 67, 82, 264/140, 57; 505/1, 725, 780, 737, 738, 742

[56] References Cited

U.S. PATENT DOCUMENTS

| 5,006,504 | 4/1991 | O'Bryan, Jr. et al. | 505/1 |
| 5,021,395 | 6/1991 | Druliner et al. | 505/1 |
| 5,100,864 | 3/1992 | Hsu | 505/1 |
| 5,200,390 | 4/1993 | Howng | 505/1 |

FOREIGN PATENT DOCUMENTS

| 0309322 | 3/1989 | European Pat. Off. |
| 0316741 | 5/1989 | European Pat. Off. |
| 0326944 | 8/1989 | European Pat. Off. |
| 0376276 | 7/1990 | European Pat. Off. |
| WO8810235 | 12/1988 | World Int. Prop. O. |

Primary Examiner—Jan H. Silbaugh
Assistant Examiner—Christopher A. Fiorilla
Attorney, Agent, or Firm—Sughrue, Mion, Zinn, Macpeak & Seas

[57] ABSTRACT

A method of preparing a powder of YBaCuO [phase 123] suitable for forming by drawing-lamination, which includes:

preparing a powdered reactive mixture of precursors of purity greater than 99% and with a stoichiometry accurate to within less than 1%, binding this powdered reactive mixture to form intermediate pieces less than two millimeters in thickness which are placed in an oven so that their contact with a support is as small as possible, a heat treating the intermediate pieces, dry grinding the intermediate pieces to obtain grains of said powder with an average diameter of the order of a few μm.

8 Claims, 4 Drawing Sheets

METHOD OF PREPARING YBA$_2$CU$_3$O$_7$ POWDER FOR FORMING BY DRAWING-LAMINATION

The present invention relates to a method for preparing a powder of YBaCuO [phase 123] for forming by drawing-lamination.

BACKGROUND OF THE INVENTION

The fact that the new superconductors, of so-called high critical temperature, are made of ceramic constitutes a great handicap because they are much more difficult to use in practice than metal superconductors of low critical temperature. The problem arises particularly when making flexible conductors such as multifilament wires and cables.

However, one family among these new compounds has a ductility which, although it does not approach that of metals, allows the production of wires by drawing or of tapes by lamination, using the method known as "powder in metal tube"; it comprises compounds $(Bi_{2-x}Pb_x)_2 Sr_2Ca_nCu_{n+1} O_{2n+6}$ (where $0 \leq n \leq 2$), the "ductility" of which is a major advantage.

In contrast, compound Y$_1$Ba$_2$Cu$_3$O$_7$ hereinafter known as Y123, although having significant advantages over the other compounds, has the usual characteristics of hardness and brittleness associated with ceramics; this has been deplored by many authors in the following publications:

| | |
|---|---|
| (1) R. FLUCKIGER: | VI International Workshop on Critical Currents 8/11 July 91 Cambridge U.K. |
| (2) T. NISHIO: | Journal of Materials Science Vol 24 (1989) p. 3228-34 |
| (3) D. F. LEE; K. SALAMA: | Physica C 181 (1991) 81-87 |
| (4) S. JIN et al: | Materials Science and Engineering B7 (1991) 243-260. |

OBJECT AND SUMMARY OF THE INVENTION

The object of the present invention is to prepare a Y123 powder of such morphology that its ability to flow approaches that of the superconductive phases of bismuth and which is quite suitable for forming by drawing-lamination.

The present invention provides a method of preparing a powder of YBaCuO [phase 123] suitable for forming by drawing-lamination, which method comprises:
preparing a powdered reactive mixture of precursors of purity greater than 99% and with stoichiometry accurate to within less than 1%,
binding this powdered reactive mixture to form intermediate pieces less than two millimeters in thickness which are placed in an oven so that their contact with a support is as small as possible,
performing heat treatment comprising at least the following stages:
  a first dwell of duration in the range 10 hours to 30 hours at a temperature $T_1$ in the range 890° C. to 910° C. in an atmosphere of 20% oxygen, corresponding to synthesis of the quadratic Y123 phase,
  a second dwell of duration in the range 20 hours to 100 hours at a temperature $T_2$ in the range 920° C. to 960° C. in an atmosphere of 20% oxygen, corresponding to re-crystallization of the quadratic Y123 phase, and
  a third dwell of duration in the range 10 hours to 50 hours at a temperature $T_3$ in the range 500° C. to 300° C. in a pure oxygen atmosphere, corresponding to transformation of the quadratic Y123 phase into the orthorhombic Y123 phase, and
dry grinding to obtain grains of said powder with an average diameter of the order of a few $\mu$m.

The values of $T_1$ and $T_2$ given above for an atmosphere of 20% oxygen should be reduced by 10° C. to 20° C. if that atmosphere contains 10% oxygen; likewise, they should be increased if the atmosphere contains 30% oxygen. The practical range of values for the oxygen partial pressure is from 5% to 30% during the heat treatment stage if the temperature is greater than $T_1$; this value may be increased to 100% during the heat treatment stage if the temperature is less than $T_1$.

The details of said heat treatment may be as follows:
rapid rise up to 800° C.
slow rise up to $T_1$
first dwell of 10 to 30 hours at $T_1$
slow rise up to $T_2$
second dwell of 20 to 100 hours at $T_2$ (longer if $T_2$ is lower)
medium fall down to 600° C.
slow fall down to $T_3$
third dwell of 10 to 50 hours at $T_3$ (longer if the thickness of said intermediate pieces is greater)
medium fall down to 250° C.
rapid fall down to 25° C.,
where:
rapid rise or fall: 120° to 60° C./hour
medium rise or fall: 60° to 40° C./hour
slow rise or fall: 40° to 20° C./hour.

In a first implementation, said reactive mixture of precursors is a powdered mixture of individual precursors Y$_2$O$_3$, BaCO$_3$, CuO activated by grinding.

In a second implementation, said reactive mixture is constituted by precursors obtained by co-precipitation, followed by filtering and drying.

In a third implementation, said reactive mixture is constituted by precursors obtained by calcination of an aerosol of nitrates of yttrium, barium and copper in solution in water.

In all implementations, the stoichiometry must be as accurate as possible.

Advantageously, said intermediate pieces may be tubes stacked in a pyramid, sheets or pellets stacked on top of one another, and separated by packing pieces; they may define a cellular structure similar to a honeycomb.

As a result of such arrangements and the fact that the contact areas between the intermediate pieces and a support in the oven are as small as possible, there is little risk of the support absorbing the liquid phase which appears during heat treatment and which generally has the composition Ba$_3$Cu$_5$O$_8$. Any fraction of the liquid phase thus lost would in fact be lost from the reactive mass and the result would be a final product polluted by parasitic compounds such as Y$_2$BaCuO$_5$.

Preserving all of the liquid phase of the reactive mass also has the effect of enhancing the growth of Y123 grains in the quadratic form.

The growth of these grains is also optimized by the choice of temperature $T_2$ within the range 920° C. to 960° C. under the 20% oxygen atmosphere. The duration of this second grain crystallization dwell is limited only by constraints of cost and by slow phenomena such as sublimation of the CuO; practical limits seem to be durations in the range 20 hours to 100 hours.

At the end of the second dwell, the residual porosity of the previously defined intermediate pieces is of the order of 10% to 15%, corresponding to a relative density of 5.8 to 5.5. As these intermediate pieces have a large ratio of surface area to volume, the oxygen diffusion distance is uniformly limited during the third heat treatment dwell; this allows transformation of the quadratic Y123 crystals into orthorhombic Y123 crystals. At the end of this transformation, the intermediate pieces obtained are homogeneous, have superconductive orthorhombic Y123 composition throughout their thickness and are stable at low temperature.

Because of the parameters of the method according to the invention, the processed intermediate pieces are homogeneous on three levels:

phase purity: the $Y_1Ba_2Cu_3O_7$ compound is not only global but local at the unit grain level, allotropic form: all the crystals are orthorhombic throughout;

crystallographic grain diameter: the spread of diameters observed on a metallographic section is narrow; 50 $\mu$m to 100 $\mu$m may be shown between two standard deviations.

As a consequence of grinding the intermediate pieces, the crystallographic grains are broken up to give a powder with an average diameter chosen to be about 10 $\mu$m, and always less than 50 $\mu$m.

BRIEF DESCRIPTION OF THE DRAWINGS

Other features and advantages of the present invention will be apparent from the following description of various implementations given by way of non-limiting example. In the drawings.

MORE DETAILED DESCRIPTION

Example 1

The following individual precursors of greater than 99% purity are weighed out accurately:
13.55 grams [b 9] of $Y_2O_3$
41.44 g of $BaCO_3$
24.66 g of CuO.

1% of "Luromine" (trademark PROTEX) is added, this being an anticoagulant additive for dry grinding. Dry grinding is performed for two hours in a planetary grinder until a diameter less than 1 $\mu$m is obtained.

Tubes of 8 mm inside diameter, 10 mm outside diameter and 70 mm length are produced by isostatic pressing of this powdered mixture at 2000 bars.

Figure 1:
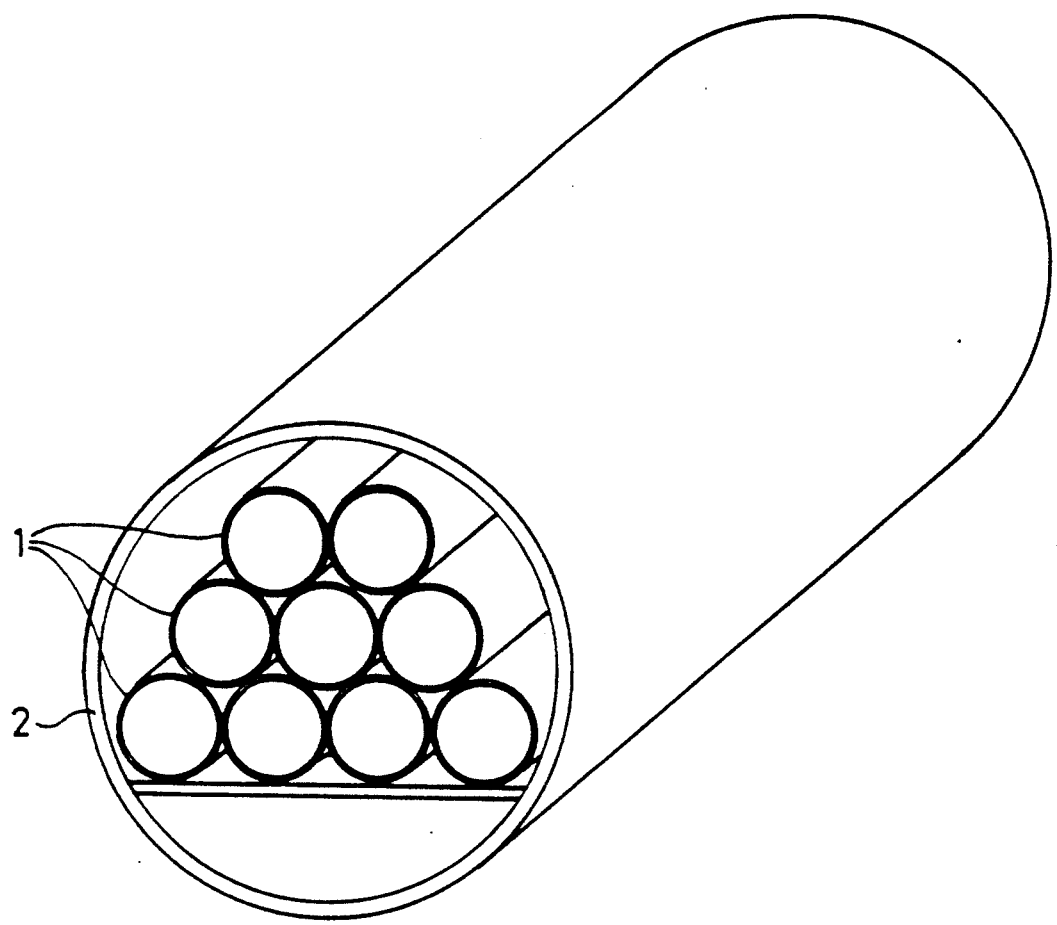
FIGS. 1 to 3 are schematic perspective views of various forms of intermediate pieces which arise during the process of preparing a powder according to the invention.
Figure 2:
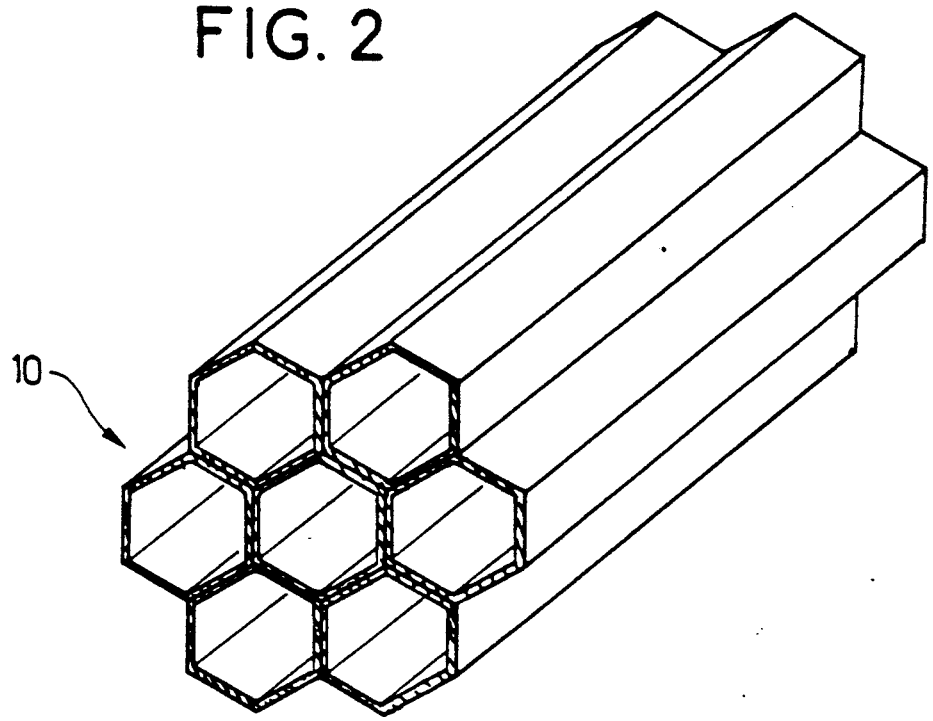
Figure 3:
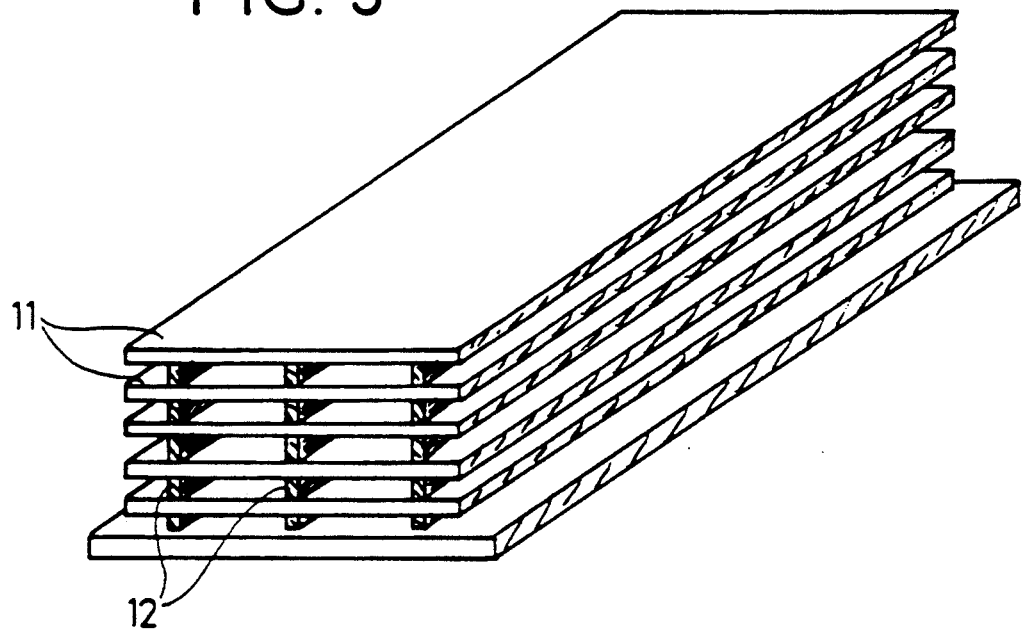

In FIG. 1 these tubes are stacked in a pyramid and heat treated in a tubular oven (shown schematically as cylinder 2) according to the following process:

| | |
|---|---|
| rise at 120° C./h up to | 800° C. |
| rise at 30° C./h up to | 900° C. |
| first dwell of 15 hours at | 900° .C |

-continued

| | |
|---|---|
| rise at 30° C./h up to | 940° C. |
| fall at 60° C./h down to | 600° C. |
| fall at 30° C./h down to | 450° C. |
| third dwell of 15 hours at | 450° C. |
| fall at 60° C./h down to | 250° C. |
| fall at 120° C./h down to | 25° C. |

The first six stages are carried out in a gaseous flow of 15 liters/hour of oxygen and 60 liters/hour of nitrogen i.e. 20% oxygen; the third dwell at 450° C. and the subsequent stages are carried out in pure oxygen.

Figure 4:
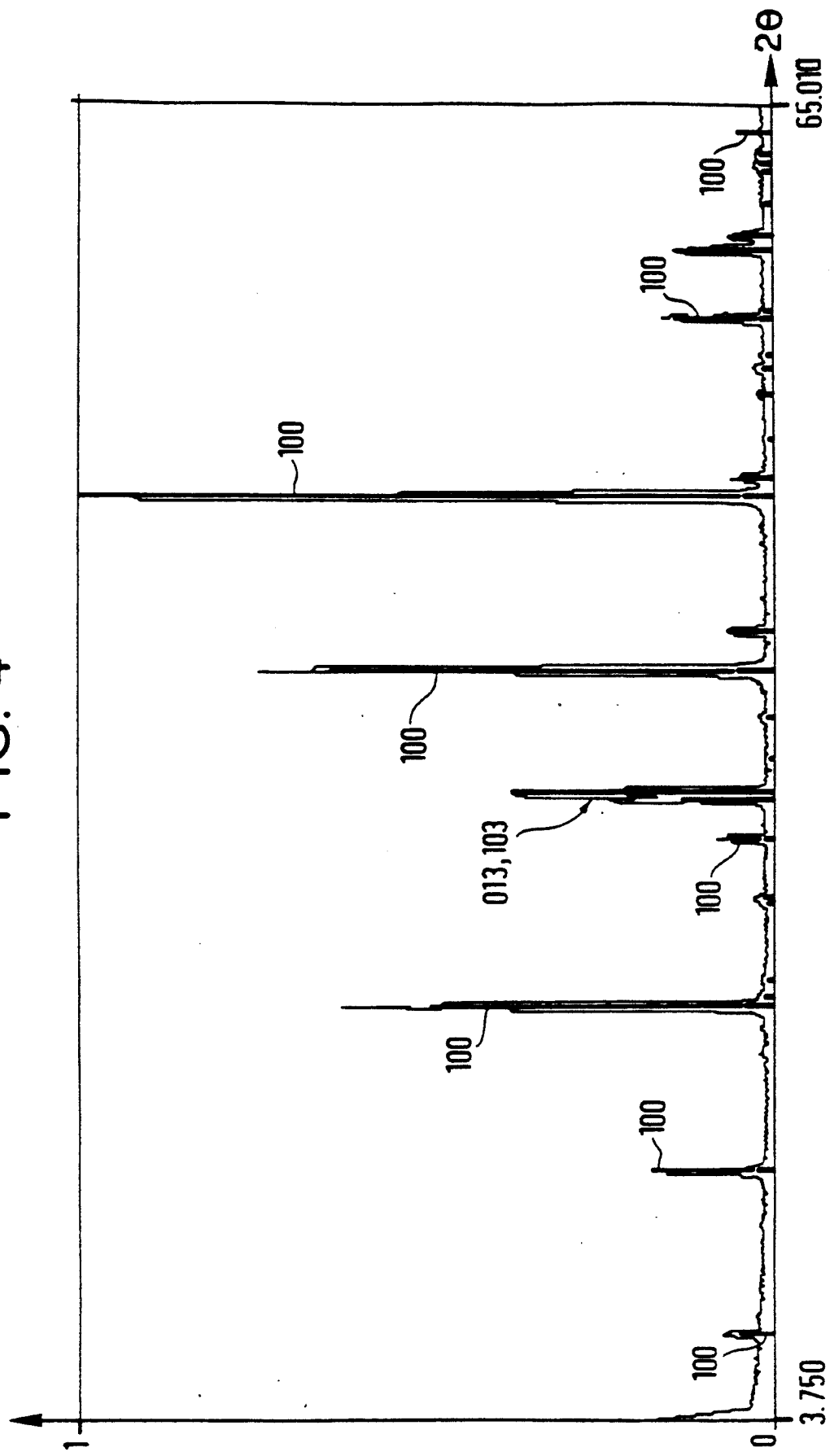
FIG. 4 is an X-ray diffraction diagram of a powder according to the invention.
Figure 5:
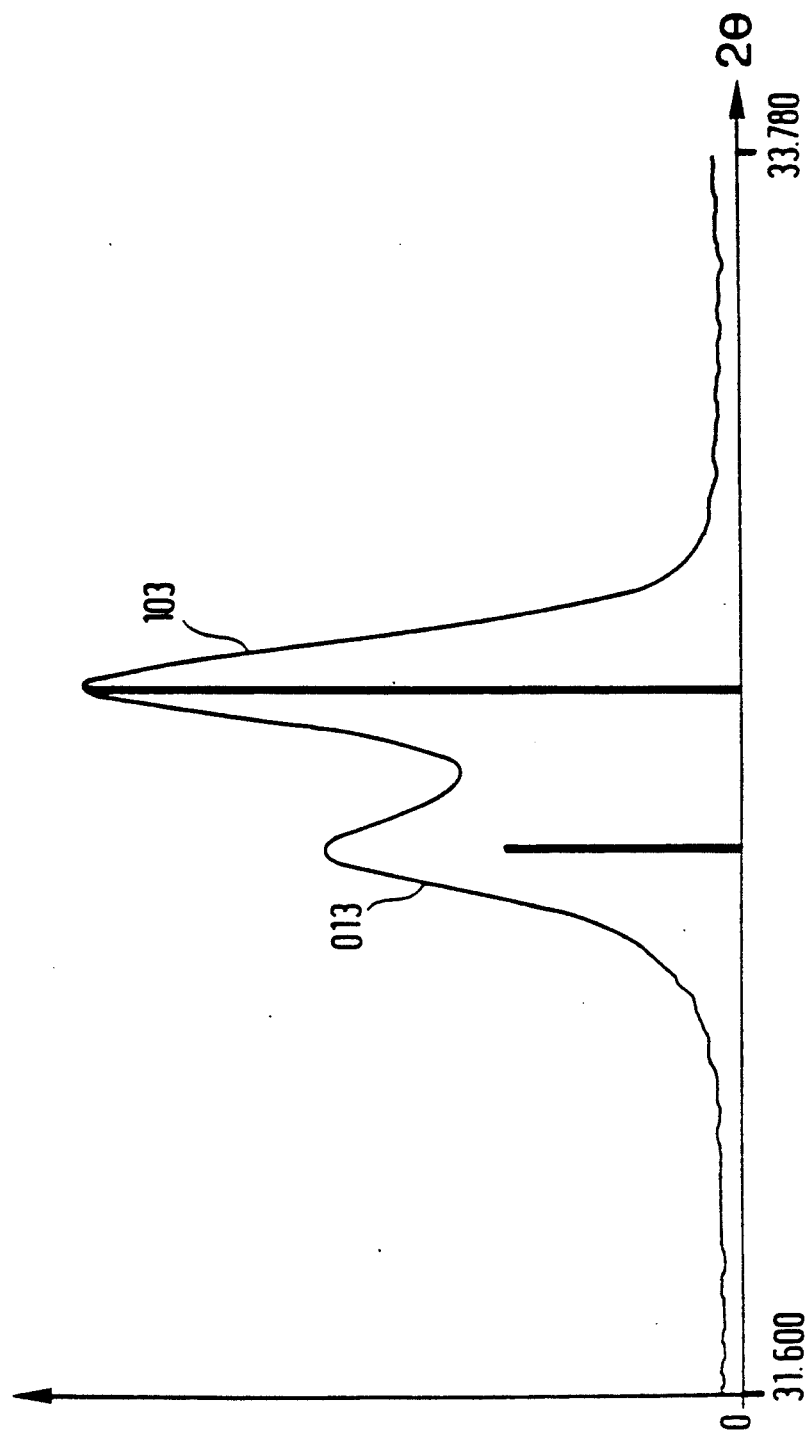
FIG. 5 is a magnified view corresponding to the 013/103 doublet of the orthorhombic form which appears in FIG. 4.

Tubes 1 are then reduced by grinding for one hour into a powder characterized by X-ray diffraction; the horizontal axis in the diagram of FIGS. 4 and 5 is the diffraction angle $2\theta$. It can be observed that the powder obtained is constituted by a pure orthorhombic phase without the usual parasitic phases $Y_2BaCuO_5$, $BaCuO_2$ and CuO. The characteristic 013/103 doublet is seen clearly in FIG. 5.

The powder is well crystallized in the form of sheets so that these sheets are parallel to the support when being prepared for the X-ray diffraction test, axis C being perpendicular to the support; this has the effect of reinforcing the 001 lines marked as 100 in FIG. 4.

Because of its relatively high ability to flow as compared with usual inorganic products, the powder according to the invention is well suited to producing a multifilament conductor by the so-called "powder-in-tube" method. This technique consists in subjecting a metal tube filled with powder to drawing-annealing cycles; after the diameter has been reduced sufficiently, a bundle of the single strands thus obtained is inserted into another tube and the process recommenced; thus individual strands of diameter about 10 $\mu$m with walls about 1 $\mu$m thick are obtained if the powder is sufficiently fluid; if not, the powder grains will pierce the wall and the filaments may even snap inside their matrix.

Example 2

This is identical to Example 1, except for the starting powder which is a commercially available product obtained by calcination of an aerosol of nitrates of yttrium, barium and calcium in solution in water; it is constituted essentially by the quadratic Y123 phase and by $Y_2BaCuO_5$, $BaCuO_2$ and CuO, but its overall stoichiometry is $Y_1Ba_2Cu_3$ to within an error of better than 1%. Each of the species in this composition takes the form of grains of about 1 $\mu$m and is therefore highly reactive.

After a treatment similar to that of Example 1, the final product is of a slightly inferior quality as far as orthorhombicity and crystallization are concerned; some agglomerates may exist in addition to the well-formed grains. Before using this type of powder, it is necessary to screen it at 50 $\mu$m. Equivalent results to those of Example 1 are then obtained.

Example 3

This is identical to Example 1, except for the form of the intermediate pieces which define a honeycomb structure 10 in which the walls are less than 2 mm thick.

Example 4

This is identical to Example 1, except for the form of the intermediate pieces which are sheets or pellets 11 of thickness less than 2 mm, stacked upon each other and separated by packing pieces.

The invention is clearly not limited to the implementations which have been described. The parameters may be modified within the framework of the indicated ranges and any means may be replaced by equivalent means without departing from the context of the invention.

We claim:

1. A method of preparing a powder of $YBa_2Cu_3O_7$ suitable for forming by drawing-lamination, which method comprises:

preparing a powdered reactive mixture of precursors of purity greater than 99% and comprising Y, Ba and Cu such that the overall stoichiometry of the mixture is $YBa_2CU_3$ accurate to less than 1%, binding said powdered reactive mixture to form intermediate pieces less than two millimeters in thickness which are placed in contact with a support in an oven so that their contact area with the support is small and liquid phase which appears during subsequent heat treating of said intermediate pieces is therefore preserved since it has little risk of being absorbed by the support, heat treating said intermediate pieces in said oven such that said heat treating comprises at least the following stages:

a first dwell of duration in the range of 10 hours to 30 hours at a temperature, $T_1$, in the range 890° C. to 910° C. in an atmosphere of 20% oxygen, corresponding to synthesis of the quadratic phase of $YBa_2Cu_3O_7$, a second dwell of duration in the range 20 hours to 100 hours at a temperature, $T_2$, in the range 920° C. to 960° C. in an atmosphere of 20% oxygen, corresponding to re-crystallization of the quadratic phase of $YBa_2Cu_3O_7$, and a third dwell of duration in the range 10 hours to 50 hours at a temperature, $T_3$, in the range 500° C. to 300° C. in a pure oxygen atmosphere, corresponding to transformation of the quadratic phase of $YBa_2Cu_3O_7$ into the orthorhombic phase of $YBa_2Cu_3O_7$, and dry grinding said heat treated intermediate pieces to obtain grains of said powder with an average diameter of the order of a few $\mu m$.

2. A method of preparation according to claim 1, wherein said reactive mixture of precursors is a powdered mixture of individual precursors $Y_2O_3$, $BaCO_3$, CuO.

3. A method of preparation according to claim 1, wherein said reactive mixture of precursors is obtained by coprecipitation, followed by filtering and drying.

4. A method of preparation according to claim 1, wherein said reactive mixture is a product obtained by calcination of an aerosol of nitrates of yttrium, barium and copper in solution in water.

5. A method of preparation according to claim 1, wherein said intermediate pieces are tubes stacked in a pyramid.

6. A method of preparation according to claim 1, wherein said intermediate pieces are sheets or pellets stacked on top of one another, and separated by packing pieces.

7. A method of preparation according to claim 1, wherein said intermediate pieces define a cellular structure.

8. A method of preparation according to claim 1, wherein said heat treatment is carried out in the following manner:
rapid rise up to 800° C.
slow rise up to $T_1$
first dwell of 10 to 30 hours at $T_1$
slow rise up to $T_2$
second dwell of 20 to 100 hours at $T_2$
medium fall down to 600° C.
slow fall down to $T_3$
third dwell of 10 to 50 hours at $T_3$
medium fall down to 250° C.
rapid fall down to 25° C.,
where:
rapid rise or fall: 120° to 60° C./hour
medium rise or fall: 60° to 40° C./hour
slow rise or fall: 40° to 20° C./hour.

* * * * *